(12) United States Patent
Sun

(10) Patent No.: US 8,728,710 B2
(45) Date of Patent: May 20, 2014

(54) PHOTO-IMAGEABLE HARDMASK WITH DUAL TONES FOR MICROPHOTOLITHOGRAPHY

(76) Inventor: Sam Xunyun Sun, Columbia, MO (US)

( * ) Notice: Subject to any disclaimer, the term of this patent is extended or adjusted under 35 U.S.C. 154(b) by 298 days.

(21) Appl. No.: 12/749,893

(22) Filed: Mar. 30, 2010

(65) Prior Publication Data

US 2012/0202349 A1 Aug. 9, 2012

Related U.S. Application Data

(60) Provisional application No. 61/164,934, filed on Mar. 31, 2009.

(51) Int. Cl.
| | | |
|---|---|---|
| G03F 7/075 | (2006.01) | |
| G03F 7/20 | (2006.01) | |
| G03F 7/30 | (2006.01) | |
| G03F 7/36 | (2006.01) | |
| G03F 7/38 | (2006.01) | |

(52) U.S. Cl.
USPC ........ 430/311; 430/270.1; 430/312; 430/313; 430/317; 430/323; 430/325; 430/326; 430/330; 430/905; 430/921; 430/925

(58) Field of Classification Search
None
See application file for complete search history.

(56) References Cited

U.S. PATENT DOCUMENTS

| | | | | |
|---|---|---|---|---|
| 6,114,082 | A | * | 9/2000 | Hakey et al. ............... 430/270.1 |
| 2006/0105181 | A1 | * | 5/2006 | Lin et al. ...................... 428/447 |
| 2009/0291389 | A1 | * | 11/2009 | Allen et al. ................ 430/270.1 |

* cited by examiner

*Primary Examiner* — Sin J. Lee

(57) ABSTRACT

Disclosed is a method of making polysiloxane and polysilsesquioxane based hardmask respond to radiations with positive tone and negative tone simultaneously. Unradiated films are insoluble in developers, showing positivity tone. Radiated films are insoluble in developers as well, showing negative tone. Only half-way radiated films are soluble in developers. The dual-tone photo-imageable hardmask produces splitted patterns. Compositions of dual-tone photo-imageable hardmask based on the chemistry of polysiloxane and polysilsesquioxanes are disclosed as well. Further disclosed are processes of using photo-imageable hardmasks to create precursor structures on semiconductor substrates with or without an intermediate layer.

8 Claims, 6 Drawing Sheets

PHOTO-IMAGEABLE HARDMASK WITH DUAL TONES FOR MICROPHOTOLITHOGRAPHY

CROSS-REFERENCE TO RELATED APPLICATIONS

This application claims the priority benefit of a provisional application entitled SELF-IMAGING HARD MASK WITH DUAL TONES FOR PHOTOLITHOGRAPHY with application No. 61/164,934 filed Mar. 31, 2009 incorporated by reference herein.

BACKGROUND OF THE INVENTION

1. Field of the Invention

The present invention relates in general to the process of microphotolithography in which a photosensitive layer and an anti-reflective coating are involved for forming structural patterns on semiconductor substrates.

2. Description of Prior Art

Photoresist for microphotolithography is a thin coating that undergoes chemical reactions when exposed to ultraviolet radiations. The chemical reactions cause the coating more or less soluble in developers. If a photoresist film is exposed to radiation image of a photomask, bias of dissolution rate between exposed and unexposed areas incurs. The image of photomask is transferred to the photoresist film after development.

If exposure to ultraviolet radiations increases solubility, the photoresist is said having a positive tone in the field of invention. As illustrated in FIG. 1, radiated regions of positive-tone photoresist are removed by developer while unexposed regions are retained on substrate. Positive-tone photoresist is widely used in the field of photolithograph for integrated circuit (IC) fabrication. Currently, the most popular photoresist is based on de-protection mechanism.

De-protection mechanism requires a resin with phenolic or carboxylic groups on side chains. The phenolic or carboxylic groups are protected by labile groups in initial films. Initial films are therefore insoluble in alkaline developers. Upon exposure to ultraviolet radiations, labile groups are hydrolyzed, and phenolic or carboxylic groups are de-protected. The phenolic or carboxylic groups make the radiated films soluble in developers. The hydrolyzation is catalyzed by photo-generated acid. One of the widely used groups is tertiary butoxycarbonyl (t-BOC).

If exposure to ultraviolet radiations decreases solubility, the photoresist is said having a negative tone in the field of invention. As illustrated in FIG. 1, radiated regions of negative-tone photoresist are retained on substrate while unexposed regions are removed by developer. Negative-tone photoresist is widely used in processes of fabricating micro-electro-mechanical systems (MEMS) or packaging integrated-circuit chips. It is hard to find instances of using negative-tone photoresist in delineating high-resolution images of precursor structures for integrated-circuit fabrication.

The less popularity is attributed to lack of viable chemistry platforms for negative photoresist. Reported negative photoresists are based on the intuitive mechanism of crosslinking. Radiations cause film resin to crosslink under catalyzation of photoacid generators. Un-crosslinked films require organic solvents to remove. However, crosslinked films are prone to swelling in organic solvents. Swelling films are not suitable for high-resolution delineating.

Obviously, photoresist of prior art can only respond to radiations in one mode, either positive tone or negative tone. For any photoresist to respond to radiations in both ways simultaneously is against conventional wisdom and beyond imagination before disclosures of the present invention. The present invention materializes dual-tone technology the first time. As shown in FIG. 1, the dual-tone films are capable of splitting projected images. Resolution is two times higher than photoresist of prior art. The films are consisted of silicon as high as 40%. Etch performance is equivalent to hardmask films.

SUMMARY OF THE INVENTION

This summary provides a simplified description of the invention as a basic overview, and does not provide detailed processes and all the critical elements of the invention. This brief overview should not be used to constrain the full scope of the invention.

The dual-tone technology of the present invention is illustrated in FIGS. 2(A), 2(B) and 2(C). FIG. 2(A) shows chrome patterns on photomask. Radiations are directed to the hardmask film through the photomask. FIG. 2(B) shows imitated photomask image that is projected on surface of the hardmask film. The image may not be visible to naked eyes, but consisted of "dark", "bright" and "gray" regions of ultraviolet radiations. The hardmask film is radiated with intensity contrast of the image. FIG. 2(C) shows hardmask patterns after development. Retained films in dark regions demonstrate the characteristic of positive tone. Retained films in bright regions demonstrate the characteristic of negative tone. The films are crosslinked and retained with lowest and highest dose of radiation. The films only in gray regions are removed by developer.

Compositions of dual-tone photo-imageable hardmask require at least a resin, catalyst, photoacid generator, and solvents. Molar ratio of photoacid generator to catalyst has to be greater than 1. Dual-tone behavior is achieved by balancing catalyzation reactions and deactivation reactions in films. If not radiated, the film is crosslinked due to condensation reactions catalyzed by the catalyst. If fully radiated, the film is crosslinked as well due to condensation reactions catalyzed by photoacid generator. If moderately radiated, catalyst is deactivated by photoacid generator. The film is not crosslinked.

Obviously, the resin is crosslinked under catalyzation of not only the catalyst, but also the photoacid generator. Polysiloxanes and polysilsesquioxanes make suitable resins. The catalyst can be easily deactivated by photoacid generator. Deactivated catalyst loses capability of catalyzing condensation reactions. Quaternary ammonium salts, such as benzyl-triethylammonium chloride (BTEAC), are suitable catalyst. Unlike prior art, functions of photoacid generator are not only to catalyze crosslinking reactions in dual-tone hardmask films, but also to deactivate the catalyst. Any photoacid generator suitable for photoresist of prior arts is generally applicable to the dual-tone hardmask compositions.

Because of high silicon content, the dual-tone photo-imageable hardmask of this invention is able to create precursor structures on semiconductor substrates with or without an intermediate layer for pattern transfer. The intermediate layer is an etch mask.

In one embodiment, dual-tone photo-imageable hardmask was used in conjunction with an intermediate layer in creating precursor structures on semiconductor substrates for fabricating integrated circuit. The intermediate layer was formed by spin-coating a composition on a polysilicon substrate. The intermediate layer had a thickness of 300 nanometers after being cured on a hot surface. A film of dual-tone hardmask was formed on top of the intermediate layer by spin-coating a composition. The film was dried by a post-application bake. The dried film had a thickness of 56±5 nanometers. The dual-tone hardmask was exposed to radiations with a wavelength of 193 nanometers through a photomask. A post-exposure bake was followed. The dual-tone hardmask was then developed in a tetramethylammonium hydroxide aqueous solution. Unexposed and exposed regions of the hardmask retained. Half-way exposed regions of the hardmask removed. Splitted images formed. The images were etched to the intermediate layer by oxygen-containing plasma. The images on the intermediate layer were then etched to the polysilicon substrate by chlorine-containing plasma.

In another embodiment, dual-tone photo-imageable hardmask was used in conjunction with a thin antireflective coating to create precursor structures on semiconductor substrates for fabricating integrated circuit. The antireflective coating of 32 nanometers was formed by spin-coating and thermally curing a composition on a polysilicon substrate. A film of dual-tone hardmask was formed on top of the thin antireflective coating by spin-applying a composition. The film was dried by a post-application bake. The dried film had a thickness of 56±5 nanometers. The dual-tone hardmask was exposed to radiations with a wavelength of 193 nanometers through a photomask. A post-exposure bake was followed. The dual-tone hardmask was then developed in a tetramethylammonium hydroxide aqueous solution. Unexposed and exposed regions of the hardmask retained. Half-way exposed regions of the hardmask were removed. Splitted images formed. The images were etched to the polysilicon substrate by oxygen- and chlorine-containing plasma. The ARC layer was etched through.

DETAILED DESCRIPTION OF THE PREFERRED EMBODIMENTS

Figure 1:
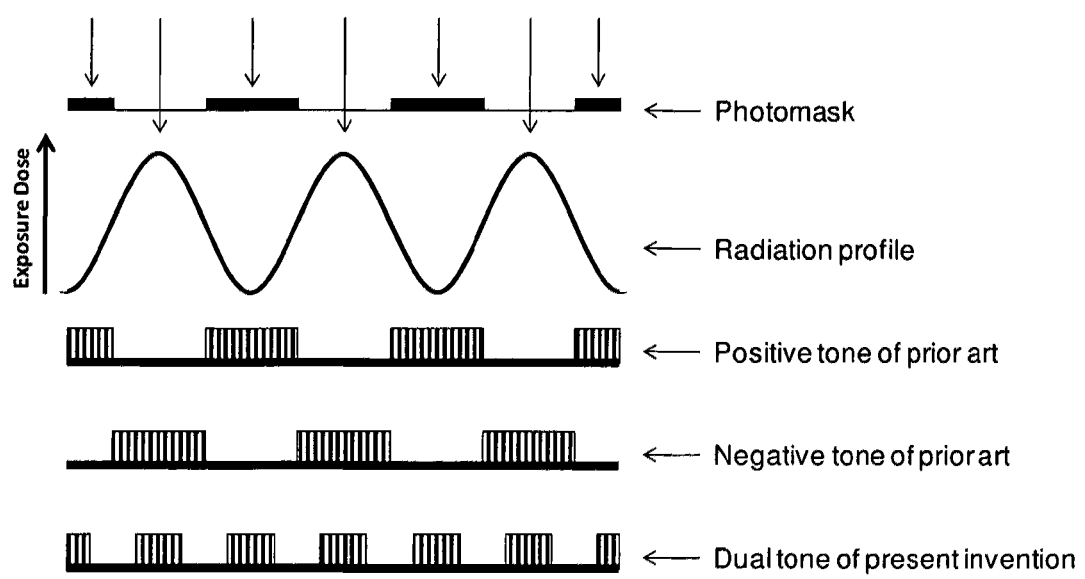
FIG. 1: Illustration of positive- and negative-tone patterns of prior art, along with dual-tone patterns of the present invention.
Figure 2A:
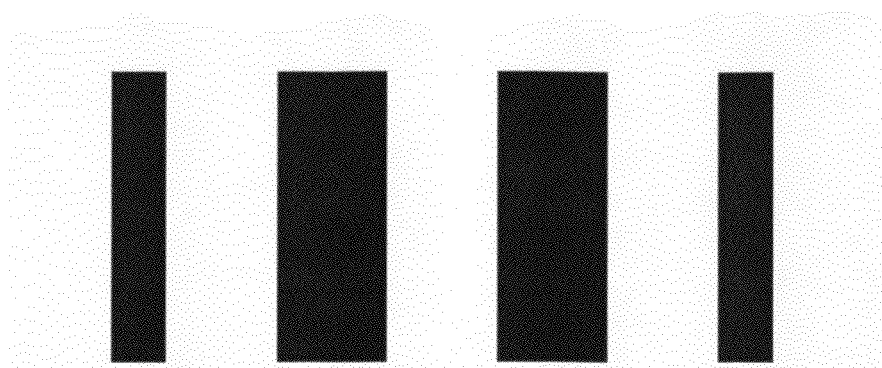
FIG. 2(A): Top-down view of photomask with chrome line patterns.
Figure 2B:
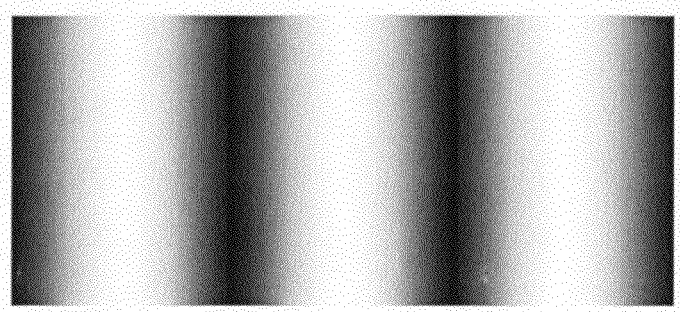
FIG. 2(B): Imitated photomask image on surface of dual-tone photo-imageable hardmask.
Figure 2C:
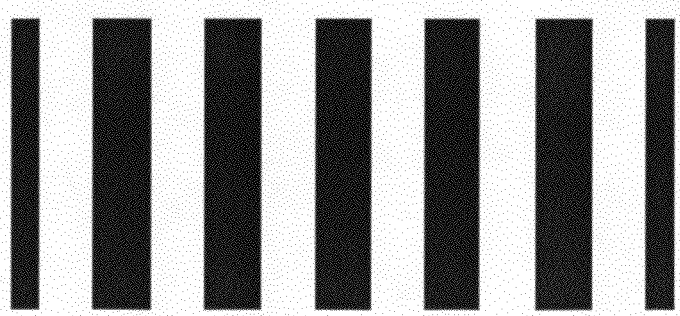
FIG. 2(C): Top-down view of splitted lines of the dual-tone hardmask.

Film-forming resins in compositions of the dual-tone photo-imageable hardmask of the present invention are consisted of polysiloxanes and polysilsesquioxanes that are pre pared from monomers with molecular formulas of (A), (B) and (C).

(A)

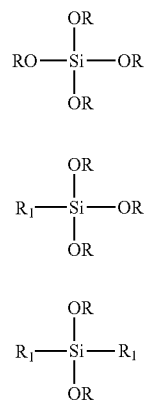

(B)

(C)

In formulas (A), (B) and (C), R is selected from the groups consisting of hydrogen and $C_1$-$C_4$ alkyls, and $R_1$ is selected from the groups consisting of alkyl, aryl, alkene, alicyclic, epoxy-alkyl, and epoxy-cycloalkyl.

The resins are formed by polymerizing monomers with molecular formulas of (A), (B) and (C). Multiple monomers with various R and $R_1$ groups are usually required to form each resin appropriate for the dual-tone hard mask. The polymerization is a condensation reaction under catalyzation. Acetic acid is one of the appropriate catalysts. Volatile alkanols are formed from the condensation reactions. The reactions take place in the medium of organic solvents. Propylene glycol methyl ether (PGME) and propylene glycol methyl ether acetate (PGMEA) are among preferred solvents. Reaction temperature is controlled preferably between 80° C. and 110° C., and more preferably between 90° C. and 100° C. The alkanols are distilled out the reactor as the reactions proceed. The distillate may include catalyst, water and solvents as well. A steady nitrogen stream flushes through the reactor to assist distillation. Polymerization is stopped when distillation is completed. Reaction time is typically from 2 to 8 hours. Weight-average molecular weight of the derived polysiloxane and polysilsesquioxane is preferably less than 50,000 grams per mole, and more preferably less than 10,000 grams per mole.

The polysiloxane and polysilsesquioxane resin is consisted of linear structures (D) and network structures (E).

(D)

(E)

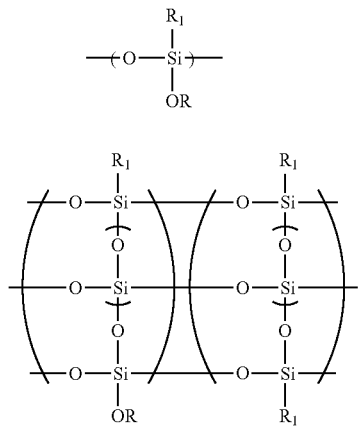

In molecular structures (D) and (E), R is selected from the groups consisting of hydrogen and $C_1$-$C_4$ alkyls, and $R_1$ is selected from the groups consisting of alkyl, aryl, alkene, alicyclic groups, epoxy-alkyl, and epoxy-cycloalkyl.

Structures (D) and (E) are simplified expressions to depict the polymer molecules. Due to the complexity and diversity of molecular structures of polysiloxanes and polylilsesquioxanes, those simplified expressions should not be taken as exact templates to confine selections of the resin polymers. The polymers should be defined by structures (D) and (E) together with information of monomers and polymerization process.

Beside the polysiloxane and polysilsesquioxane resin, other essential constituents of the compositions include film-modifier, catalyst, photoacid generator, quencher, and solvents. Molar ratio of photoacid generator to catalyst has to be greater than 1.

Function of the film-modifier is to control the diffusion length of catalysts, photoacid generators and quenchers in the film. Molecules of the film-modifier fill in the film pores and constrain diffusion pathways of other small molecules. Suitable film-modifiers are selected from polymers, oligomers, or non-polymeric compounds. Weight-average molecular weight of the polymers and oligomers is preferably lower than 5,000 grams per mole, and more preferably lower than 2,000 grams per mole. Film-modifier may be a hydrocarbon compound, but preferably a silicon-containing compound. At least one hydroxyl group is attached to each film-modifier molecule. The hydroxyl groups participate condensation reactions of the film resin in the delineating process. Exemplary hydrocarbon film-modifiers include polyols such as 1,1,1-tris(hydroxymethyl)ethane and pentaerythritol. Exemplary silicon-based modifiers include silanols such as diphenylsilanediol. Film-modifier should not exceed 30%, and more preferably 10%, of the resin by weight. Concentrations of film-modifier in compositions are used to control diffusion lengths. Multiple film-modifiers may be used in one composition.

The catalysts must meet two criteria: (1) Capable of catalyzing condensation reactions of polysiloxane and polysilsquioxane; (2) Easy to be deactivated by photo-generated acid. Deactivated catalyst loses capabilities of catalyzation. A variety of compounds are qualified as the catalyst, since condensation reactions of polysiloxane and polysilsquioxane can be catalyzed by both base and acid. Quaternary ammonium salts, such as benzyltriethylammonium chloride (BTEAC), tetramethylammonium chloride (TMAC), and tetramethylammonium hydroxide (TMAH), are proven efficient as the catalyst. Amines, such as triethanol amine, are suitable catalysts as well. Catalyst load in compositions of the photo-imageable hardmask is preferably from 0.1% to 4% of the resin by weight.

Unlike prior art, functions of photoacid generator are not only to catalyze crosslinking reactions, but also to deactivate the catalyst in the film of dual-tone photo-imageable hardmask. Deactivation is accomplished by rapid and thorough reactions such as neutralization between base and acid. Photoacid generators are compounds that release acid upon exposure to radiations with desired wavelengths. All known photoacid generators for compositions of de-protection photoresist are practically applicable to dual-tone hardmasks. Consideration shall be given to the diffusion aspect of photoacid generators in polysiloxane and polysilsesquioxane films. Suitable photoacid generators include onium salts such as sulfonium and iodinium salts. Sulfonium salts are compounds of sulfonium cations and sulfonates or methides. Exemplary sulfonium cations include triphenylsulfonium and tris(4-tert-butoxyphenyl)sulfonium. Exemplary sulfonates include trifluoromethanesulfonate and perfluoro-1-butanesulfonate. Exemplary methides include tris(trifluoromethyl)methide. Iodinium salts are compounds of iodonium cations and sulfonates. Exemplary iodinium cations are aryliodonium cations including diphenyliodinium and bis(4-tert-butylphenyl)iodonium. Exemplary sulfonates include trifluoromethanesulfonate and perfluoro-1-butanesulfonate. Triphenylsulfonium tris(trifluoromethyl)methide is an especially important photoacid generator for compositions of the positive-tone photo-imageable hardmask. Molar ratio of photoacid generator to catalyst is preferably 1 to 3.

Quencher in the compositions of dual-tone photo-imageable hardmask has two functions. One is to control photo-speed at reasonable levels by neutralizing unwanted photo-generated acid. Another is to counteract the diffusion of photoacid generators. A variety of amines are suitable quenchers for the dual-tone hardmask. Tested and proved quenchers include n-boc-piperidine, t-butyl 4-hydroxy-1-piperidinecarboxylate, triethanol amine, 1-piperidineethanol, and benzyltriethylammonium chloride. Molar ratio of quencher to photoacid generator is preferably from 0.2 to 10.

Suitable solvents for the compositions of dual-tone photo-imageable hardmask include, but are not limited to, propylene glycol methyl ether (PGME), propylene glycol methyl ether acetate (PGMEA), and ethyl lactate (EL).

The compositions of dual-tone photo-imageable hardmask are formulated by mixing the ingredients under agitation. When all the solids dissolved, the compositions are filtered through membranes with 0.02-micrometer pores. Solid content of the compositions of dual-tone hardmask is between 1% and 10%.

The compositions of dual-tone photo-imageable hardmask are applied on substrates preferably by spin-coating to form uniformed films. Spin speed can range from 1500 revolution per minute to 5000 revolution per minute. Spin-formed films of the dual-tone hardmask need to be dried on a hotplate surface of preferably 40° C.-120° C., and more preferably 60° C.-100° C., for preferably 30 seconds to 120 seconds, and more preferably 30 seconds to 60 seconds. The dried films of dual-tone hardmask are soluble in organic solvents or alkaline aqueous solutions.

Elemental silicon constitutes 30%-41%, and more commonly 35%-40%, of dried films of dual-tone hardmask by weight. As a reference, pure silicon dioxide is consisted of 46.7% silicon. The silicon-rich dual-tone hardmask is highly resistant to attacks from oxygen, chlorine, and HBr plasmas.

Film thickness is adjustable by viscosity of the compositions, and speed of spin-coating. For processes of photolithographic patterning, film thickness may range from 10 nanometers to 100 nanometers, and more preferably from 40 nanometers to 100 nanometers. Refractive index (n) of the films is preferably from 1.4-1.9, and more preferably from 1.5-1.8. Extinction coefficient (k) of the films is preferably from 0.01 to 0.4.

The dual-tone photo-imageable hardmask is ready for radiation exposure immediately after the post-application bake. Suitable radiation source for the exposure may have a wavelength that is commonly used in the field of invention, such as 365 nanometers, 248 nanometers, 193 nanometers, and 13.5 nanometers. In general, radiations with wavelengths shorter than 400 nanometers are preferred. A photomask with desired chrome patterns is placed between radiation source and surface of the photo-imageable hardmask. Image of the patterns is projected onto the hardmask surface. The image may not be visible to naked eyes, but radiation contrast with "bright", "gray" and "dark" regions are defined.

If the space between projection lens of the exposure tool and surface of the photo-imageable hardmask is filled with a fluid, known as immersion lithography in the field of invention, a top-coat may be needed. The top-coat may preserve the physicochemical properties of the photo-imageable hardmask surface, in addition to reduce risks of leaching from the hardmask.

Bake on a hotplate surface is necessary immediately after the exposure. Appropriate bake temperatures are preferably 60° C.-120° C., and more preferably 80° C.-100° C., for preferably 30 seconds to 120 seconds, and more preferably 30 seconds to 60 seconds. The post-exposure bake (PEB) accelerates crosslinking reactions of the resin, and deactivation reactions of the catalyst.

In dark regions of the exposure, not enough acid is generated to deactivate the catalyst. The catalyst is able to catalyze condensation reactions of the polysiloxane and polysilsesquioxane resin. The condensation reactions may start at ambient temperature, but complete after the post-exposure bake. The condensation reactions create inter- and intra-molecule linkage bonds in the format of "—Si—O—". The film in dark regions is therefore crosslinked and becomes insoluble in developers. In other words, the dual-tone hardmask is not soluble when not exposed to radiations. The film responds to radiations in a positive tone.

In bright regions of the exposure, enough acid is generated from radiations not only to deactivate the entire catalyst but also to catalyze crosslinking reactions. "Deactivation" herein is a common terminology for any reactions, including neutralization between acid and base, that disable the functionality of the catalyst. Such reactions can be very rapid and thorough. The deactivation reactions may produce water or volatile byproducts. The deactivation and crosslinking reactions may start at ambient temperature and complete at the temperature of post-exposure bake. The acid-catalyzed crosslinking reactions make the film insoluble in developers. In other words, the dual-tone hardmask becomes insoluble when exposed to radiations. The film responds to radiations in a negative tone.

In gray regions of the exposure, there is not excess acid generated from radiations to cause crosslinking reactions, but enough acid to deactivate the catalyst. Therefore, crosslinking reactions do not take place due to lack of catalyst and photo-generated acid. The film in this region, like the initial film, remains soluble in developer. Dissolution of the film in this region separates the films in exposed and unexposed regions. Patterns are splitted. Photolithographic resolution is enhanced by factor of two. The "gray" information of exposure always exists, but wasted by conventional photoresist.

Suitable developers for the dual-tone hardmask may be organic solvents or alkaline aqueous solutions. The latter is more preferable. Preferred organic solvents include, but are not limited to, propylene glycol methyl ether (PGME), propylene glycol methyl ether acetate (PGMEA), ethyl lactate (EL), and cyclohexanone. Preferred alkaline developers may be water solutions of organic or inorganic bases, including tetramethylammonium hydroxide (TMAH), potassium hydroxide, and sodium hydroxide. The most preferable developer is aqueous solutions of tectramethylammonium hydroxide with concentrations ranging from 2.5 to 25 grams per liter.

Dual-tone photo-imageable hardmask of the present invention is capable of forming precursor patterns on semiconductor substrates with or without an intermediate layer. Intermediate layer is a coating of organic polymers with a thickness between 100 nanometers and 500 nanometers. Intermediate layer functions as a mask to protect substrates from plasma etch. It serves as an antireflective coating as well. If intermediate layer is not needed, a thin antireflective coating is used to control reflection of radiations from substrates. Antireflective coating has a thickness between 20 nanometers and 80 nanometers. This thin layer is not an etch mask.

Figure 3A:
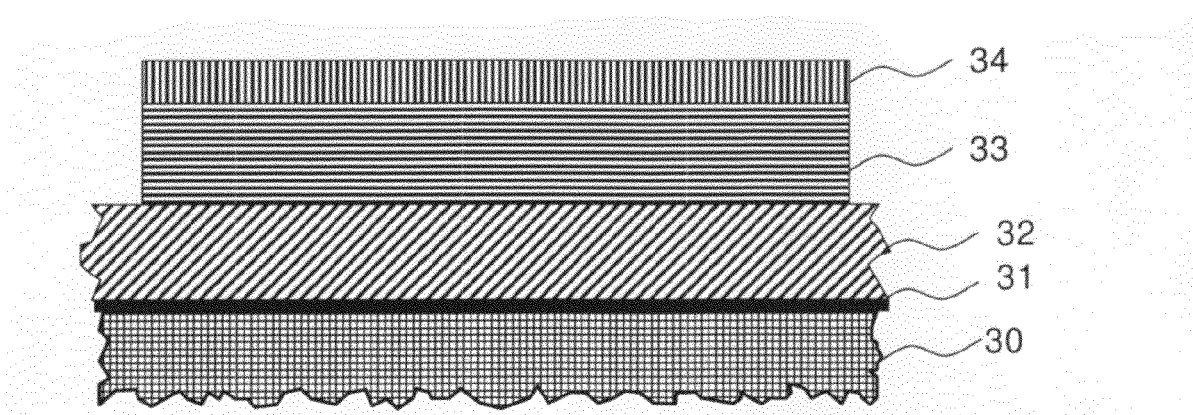
FIG. 3(A): Film stack for dual-tone photo-imageable hardmask process with an intermediate layer.

FIG. 3(A) shows film stack of one embodiment that the dual-tone photo-imageable hardmask was used in conjunction with an intermediate layer. The intermediate layer (33) was formed by spin-coating a composition on a polysilicon substrate (32) which was on an etch-stop layer (31). The carrier of the films is a silicon wafer (30). The substrate can be any of the common materials used in integrated circuitry (IC) fabrication, such as polysilicon, dielectrics, and metals. The substrate may have a flat or topographic surface. The intermediate layer (33) was cured on a hotplate surface of 200° C. for 60 seconds. Thickness of the intermediate layer (33) was 320±10 nanometers.

A composition of dual-tone photo-imageable hardmask was spin-coated on top of intermediate layer (33), and followed by a bake on a hotplate surface of 60° C. for 90 seconds. The dual-tone hardmask (34) had a thickness of 56±5 nanometers.

Figure 3B:
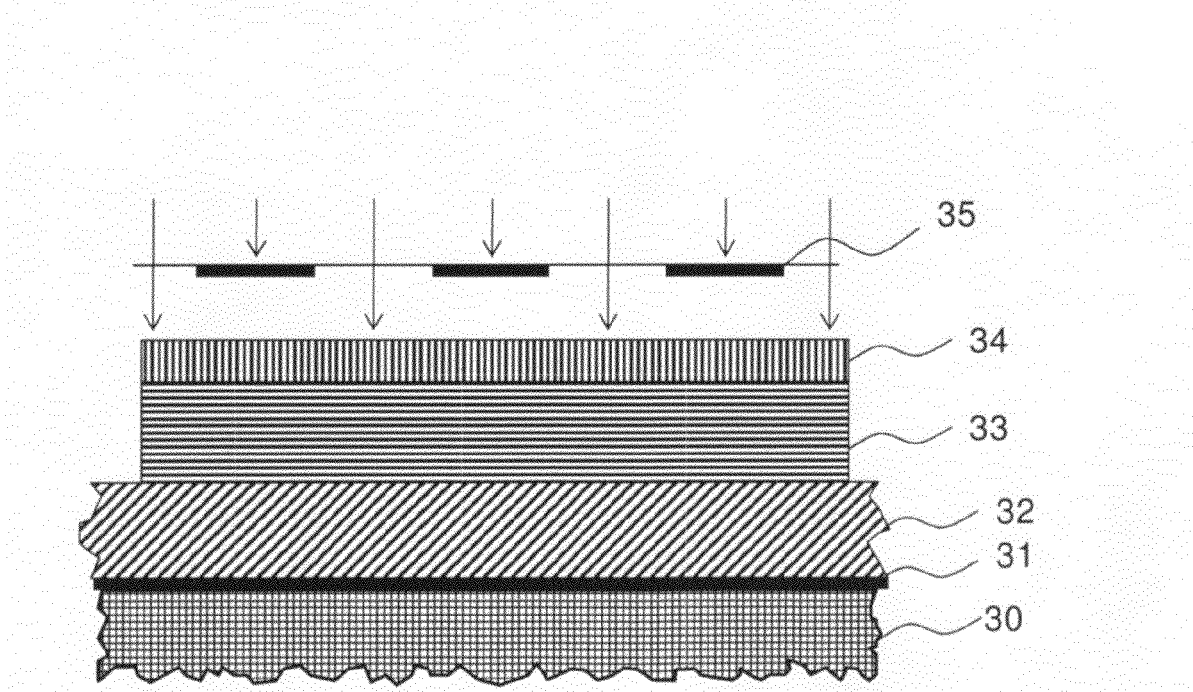
FIG. 3(B): Dual-tone photo-imageable hardmask being exposed to radiations through a photomask.
Figure 3C:
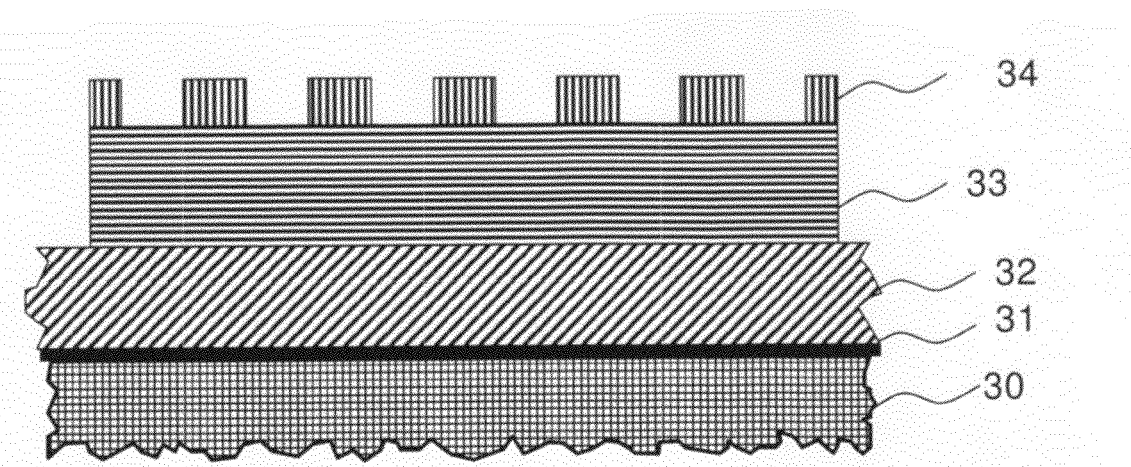
FIG. 3(C): Cross-section view of splitted patterns formed on dual-tone hardmask.

FIG. 3(B) shows the dual-tone hard mask (34) being exposed to radiations with a photomask (35). Pattern images on the photomask (35) were projected on surface of the dual-tone hardmask (34). The radiation had a wavelength of 193 nanometers. The exposure was followed by a bake on a hotplate surface of 100° C. for 90 seconds. The wafer was then submerged in an aqueous solution of tetramethylammonium hydroxide with a concentration of 4.7 grams per liter for development. Half-way exposed portions of the dual-tone hardmask dissolved in the developer. Splitted patterns (in FIG. 3(C)) formed on the dual-tone hardmask (34).

Figure 3D:
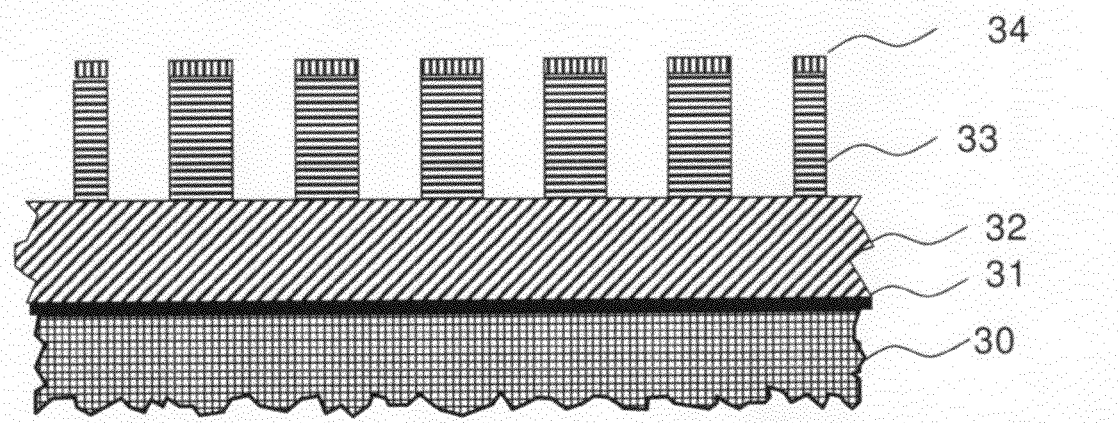
FIG. 3(D): Cross-section view of patterns on intermediate layer formed by plasma etch.

FIG. 3(D) shows that patterns on the dual-tone photo-imageable hardmask (34) were transferred to the intermediate layer (33) by oxygen-containing plasma. Portions of the intermediate layer (33) that were subjected to plasma were removed. Portions of the intermediate layer (33) that were protected by the dual-tone hard mask (34) were intact. Residual dual-tone hard mask (34) was still visible.

Figure 3E:
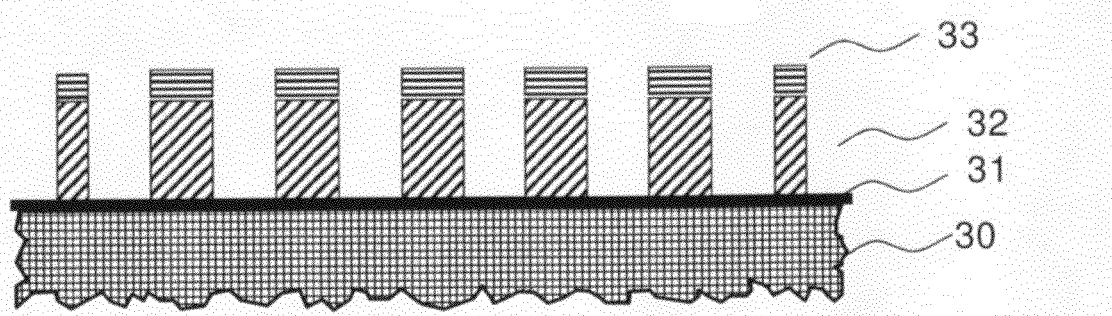
FIG. 3(E): Cross-section view of patterns on substrate formed by plasma etch.

FIG. 3(E) shows that patterns on the intermediate layer (33) were transferred to the substrate (32) by chlorine-containing plasma. Portions of the substrate (32) that were subjected to plasma were removed. Portions of the substrate (32) that were protected by the intermediate layer (33) were intact. Residual intermediate layer (33) was still visible.

Figure 4A:
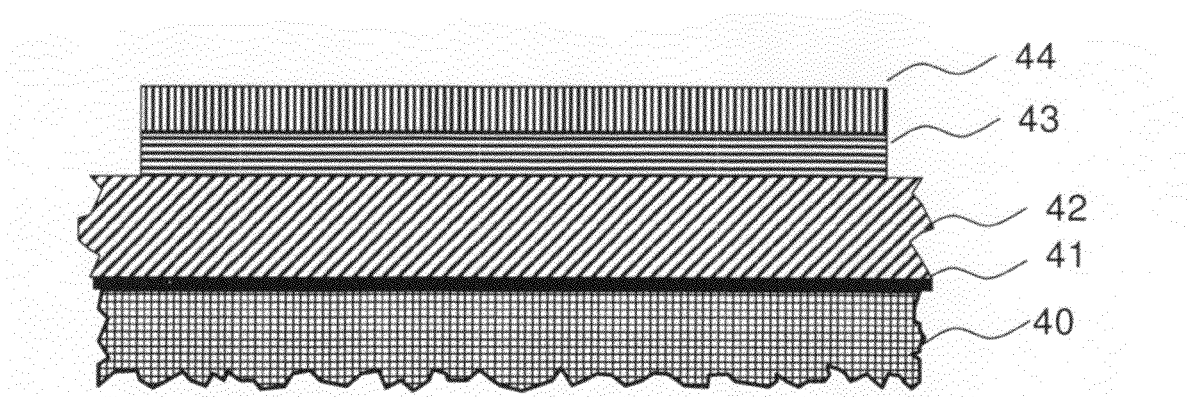
FIG. 4(A): Film stack for dual-tone photo-imageable hardmask process with thin antireflective coating.

FIG. 4(A) shows film stack of another embodiment that the dual-tone photo-imageable hardmask was used in conjunction with a thin anti-reflective coating (ARC). The antireflective coating (43) was formed by spin-coating a composition on a polysilicon substrate (42) which was on an etch-stop layer (41). The carrier of the films was a silicon wafer (40). The substrate can be any of the common materials used in integrated circuitry (IC) fabrication, such as polysilicon, dielectrics, and metals. The substrate may have a flat or topographic surface. The antireflective coating was cured on a hotplate surface of 200° C. for 60 seconds. The antireflective coating (43) had a thickness of 32±2 nanometers that was optimal for reflectivity control. The thin antireflective coating (43) did not serve as an etch mask.

A composition of the dual-tone photo-imageable hardmask was spin-coated on top of the antireflective coating (43), and followed by a bake on a hotplate surface of 60° C. for 90 seconds. The dual-tone hardmask film (44) had a thickness of 56±5 nanometers.

Figure 4B:
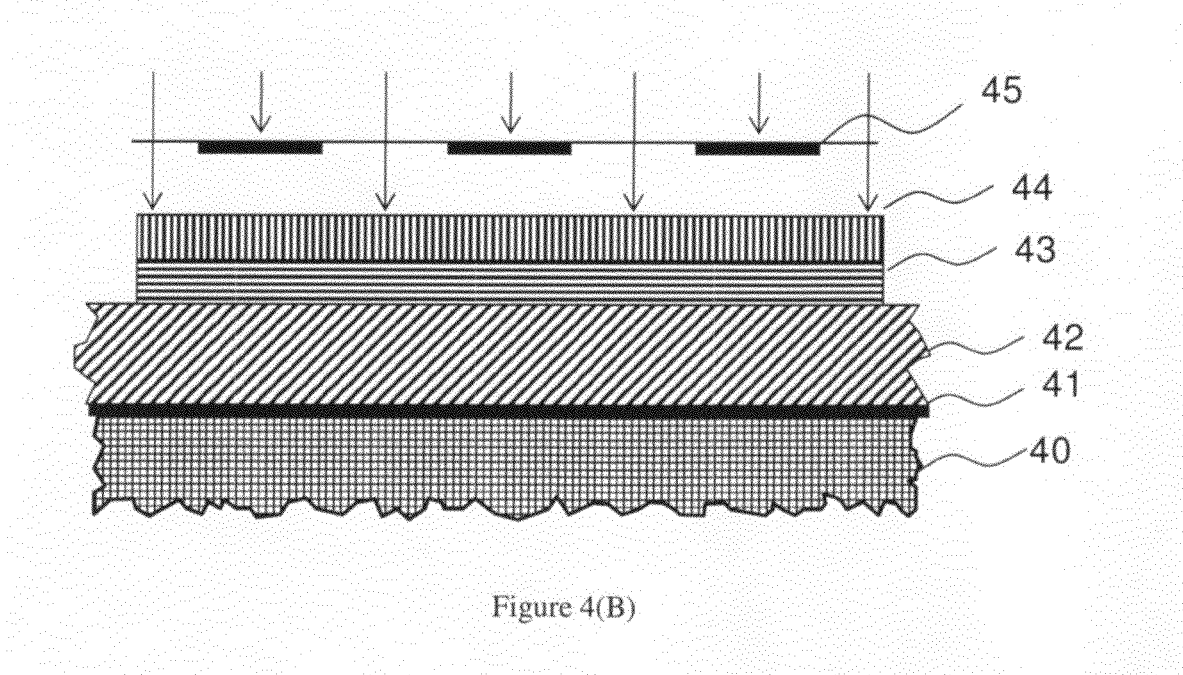
FIG. 4(B): Dual-tone photo-imageable hardmask being exposed to radiations through a photomask.
Figure 4C:
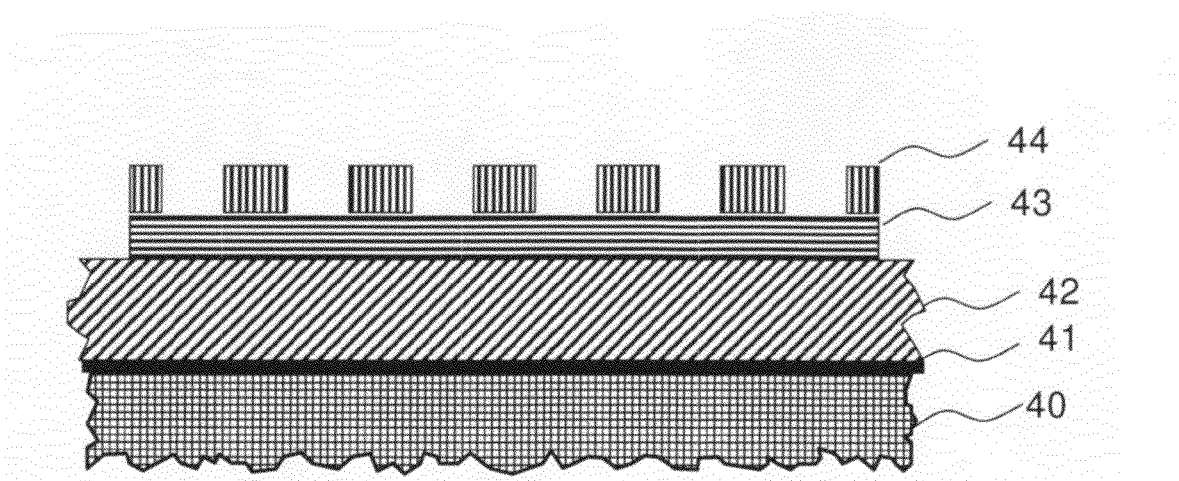
FIG. 4(C): Cross-section view of splitted patterns formed on dual-tone hardmask.

FIG. 4(B) shows the dual-tone hard mask (44) being exposed to radiations with a photomask (45). Pattern images on the photomask (45) were projected on surface of the dual-tone hardmask (44). The radiation had a wavelength of 193 nanometers. The exposure was followed by a bake on a hotplate surface of 100° C. for 90 seconds. The wafer was submerged in an aqueous solution of tetramethylammonium hydroxide with a concentration of 4.7 grams per liter for development. Half-way radiated portions of the dual-tone hardmask dissolved in the developer. Splitted patterns (in FIG. 4(C)) formed on the dual-tone hardmask (44).

Figure 4D:
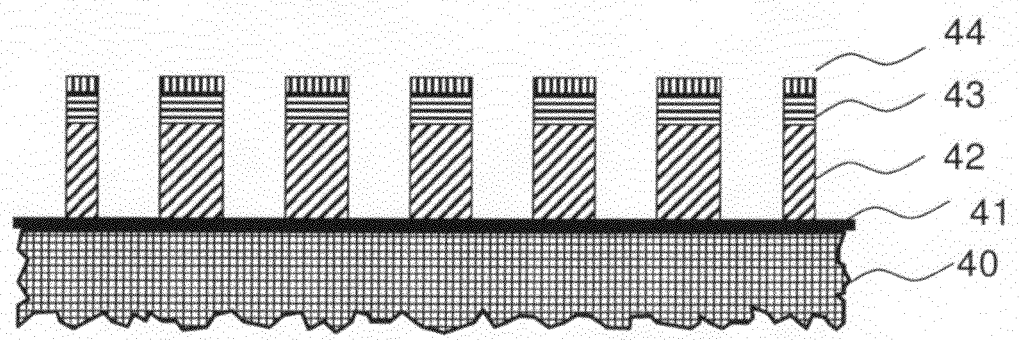
FIG. 4(D): Cross-section view of patterns on substrate formed by plasma etch.

FIG. 4(D) shows that patterns on the dual-tone hardmask (44) were transferred to the substrate (42) by oxygen- and chlorine-containing plasma. Portions of the antireflective coating (43) and substrate (42) that were subjected to plasma were removed. Portions of the antireflective coating (43) and substrate (42) that were protected by the photo-imageable hardmask (44) were intact. The antireflective coating (43) was punched through by plasma due to the thin thickness and fast etch rate. Residual photo-imageable hardmask (43) was still visible.

EXAMPLES

The following examples set forth preferred methods in accordance with the invention. It is to be understood, however, that these examples are provided by way of illustration and nothing therein should be taken as a limitation upon the overall scope of the invention.

Example 1

Synthesis of Polysiloxane and Polysilsesquioxane Resin I

TABLE 1

| Monomers for Polysiloxane and Polysilsesquioxane Resin I: | |
|---|---|
| Methyl trimethoxy silane (Gelest, Morrisville, PA) | 65.2 grams |
| Tetraethoxy silane (Gelest, Morrisville, PA) | 26.6 grams |
| Phenyl trimethoxy silane (Gelest, Morrisville, PA) | 5.06 grams |
| 2-(3,4-Epoxycyclohexyl)ethyl trimethoxy silane (Gelest, Morrisville, PA) | 1.57 grams |

Monomers in Table 1, together with 80 grams of propylene glycol methyl ether acetate (from Sigma Aldrich (Milwaukee, Wis.)), were mixed in a 500-mL three-neck round-bottom flask. Attached to the flask were distillation condenser, thermometer, and nitrogen inlet. Nitrogen flow was set at 200 milliliters per minute. With stirring, temperature of the mixture in the flask was raised to 95° C. in oil bath. Then, 50 grams of 3-nomal acetic acid were slowly added to the flask. Condensation reactions began. Volatile byproducts were distilled out of the flask and collected. Distillation completed in four hours. Heating stopped immediately after distillation is finished. Totally 96 grams of distillate were collected. Fresh propylene glycol methyl ether acetate of 164 grams was immediately added to the flask to reduce temperature. Final content of the flask was used, as Resin I, for compositions of the positive-tone photo-imageable hardmask without further processing.

Example 2

Synthesis of Polysiloxane and Polysilsesquioxane Resin II

TABLE 2

| Monomers for Polysiloxane and Polysilsesquioxane Resin II: | |
|---|---|
| Methyl trimethoxy silane (Gelest, Morrisville, PA) | 66.2 grams |
| Tetraethoxy silane (Gelest, Morrisville, PA) | 26.6 grams |
| Phenyl trimethoxy silane (Gelest, Morrisville, PA) | 5.06 grams |

Monomers in Table 2, together with 80 grams of propylene glycol methyl ether acetate (from Sigma Aldrich (Milwaukee, Wis.)), were mixed in a 500-mL three-neck round-bottom flask. Attached to the flask were distillation condenser, thermometer, and nitrogen inlet. Nitrogen flow was set at 200 milliliters per minute. With stirring, temperature of the mixture in the flask was raised to 95° C. in oil bath. Then, 50 grams of 3-nomal acetic acid were slowly added to the flask. Condensation reactions began. Volatile byproducts were distilled out of the flask and collected. Distillation completed in four hours. Heating stopped immediately after distillation is finished. Totally 102 grams of distillate were collected. Fresh propylene glycol methyl ether acetate of 164 grams was immediately added to the flask to reduce temperature. Final content of the flask was used, as Resin II, for compositions of the positive-tone photo-imageable hardmask without further processing.

Example 3

Dual-Tone Photo-Imageable Hardmask Composition I

TABLE 3

| Ingredients of Dual-tone Photo-imageable Hardmask Composition I | |
|---|---|
| Resin I (from Example 1) | 39 grams |
| 1,1,1-Tris(hydroxymethyl)ethane (Aldrich, Milwaukee, WI) | 0.1 grams |
| Triphenylsulfonium tris(trifluoromethyl)methide (Ciba, Basel, Switzerland) | 0.06 grams |
| t-Butyl 4-hydroxy-1-piperidinecarboxylate (Aldrich, Milwaukee, WI) | 0.06 grams |
| Benzyltriethylammonium chloride (Aldrich, Milwaukee, WI) | 0.02 grams |
| Propylene glycol methyl ether acetate | 100 grams |

Composition I was made by mixing the ingredients in Table 3. When all the solids dissolved, the composition was filtered through a membrane with 0.02-micrometer pores. In the composition, film-modifier, that is 1,1,1-tris(hydroxymethyl)ethane), is 2.7% of the resin by weight. Molar ratio of photoacid generator, that is triphenylsulfonium tris(trifluoromethyl)methide, to catalyst, that is benzyltriethylammonium chloride, is 1.42. Catalyst load is 0.014% of total weight.

Photolithographic Conditions for Composition I:

| | |
|---|---|
| Wafer spin speed for coating | 1500-3000 revolutions per minute for film thickness of 40-60 nanometers |
| Post-application bake | 60-100° C. for 60 seconds |
| Suitable radiation wavelengths | 193 nanometers and 13.5 nanometers |

-continued

| | |
|---|---|
| Post-exposure bake | 60-120° C. for 90 seconds |
| Development | 10 seconds to 40 seconds in 4.8 grams of tetramethylammonium hydroxide per liter aqueous solution by spray, puddling or submerge |

Film of Composition I after post-exposure bake is consisted of 36% or more silicon by weight.

Example 4

Dual-Tone Photo-Imageable Hardmask Composition II

TABLE 4

Ingredients of Dual-tone Photo-imageable Hardmask Composition II

| | |
|---|---|
| Resin I (from Example 1) | 39 grams |
| 1,1,1-Tris(hydroxymethyl)ethane (Aldrich, Milwaukee, WI) | 0.1 grams |
| Triphenylsulfonium tris(trifluoromethyl)methide (Ciba, Basel, Switzerland) | 0.08 grams |
| t-Butyl 4-hydroxy-1-piperidinecarboxylate (Aldrich, Milwaukee, WI) | 0.06 grams |
| Benzyltriethylammonium chloride (Aldrich, Milwaukee, WI) | 0.02 grams |
| Propylene glycol methyl ether acetate | 100 grams |

Composition II was made by mixing the ingredients in Table 4. When all the solids dissolved, the composition was filtered through a membrane with 0.02-micrometer pores. In the composition, film-modifier, that is 1,1,1-tris(hydroxymethyl)ethane), is 2.7% of the resin by weight. Molar ratio of photoacid generator, that is triphenylsulfonium tris(trifluoromethyl)methide, to catalyst, that is benzyltriethylammonium chloride, is 1.89. Catalyst load is 0.014% of total weight.

Photolithographic Conditions for Composition II:

| | |
|---|---|
| Wafer spin speed for coating | 1500-3000 revolutions per minute for film thickness of 40-60 nanometers |
| Post-application bake | 60-100° C. for 60 seconds |
| Suitable radiation wavelengths | 193 nanometers and 13.5 nanometers |
| Post-exposure bake | 60-120° C. for 90 seconds |
| Development | 10 seconds to 40 seconds in 4.8 grams of tetramethylammonium hydroxide per liter aqueous solution by spray, puddling or submerge |

Film of Composition II after post-exposure bake is consisted of 36% or more silicon by weight.

Example 5

Dual-Tone Photo-Imageable Hardmask Composition III

TABLE 5

Ingredients of Dual-tone Photo-Imageable Hardmask Composition III

| | |
|---|---|
| Resin I (from Example 1) | 39 grams |
| 1,1,1-Tris(hydroxymethyl)ethane (Aldrich, Milwaukee, WI) | 0.1 grams |
| Triphenylsulfonium triflate (Aldrich, Milwaukee, WI) | 0.08 grams |
| t-Butyl 4-hydroxy-1-piperidinecarboxylate (Aldrich, Milwaukee, WI) | 0.06 grams |
| Benzyltriethylammonium chloride (Aldrich, Milwaukee, WI) | 0.02 grams |
| Propylene glycol methyl ether acetate | 100 grams |

Composition III was made by mixing the ingredients in Table 5. When all the solids dissolved, the composition was filtered through a membrane with 0.02-micrometer pores. In the composition, film-modifier, that is 1,1,1-tris(hydroxymethyl)ethane), is 2.7% of the resin by weight. Molar ratio of photoacid generator, that is triphenylsulfonium triflate, to catalyst, that is benzyltriethylammonium chloride, is 2.21. Catalyst load is 0.014% of total weight.

Photolithographic Conditions for Composition III:

| | |
|---|---|
| Wafer spin speed for coating | 1500-3000 revolutions per minute for film thickness of 40-60 nanometers |
| Post-application bake | 60-100° C. for 60 seconds |
| Suitable radiation wavelengths | 193 nanometers and 13.5 nanometers |
| Post-exposure bake | 60-120° C. for 90 seconds |
| Development | 10 seconds to 40 seconds in 4.8 grams of tetramethylammonium hydroxide per liter aqueous solution by spray, puddling or submerge |

Film of Composition III after post-exposure bake is consisted of 36% or more silicon by weight.

Example 6

Dual-Tone Photo-Imageable Hardmask Composition IV

TABLE 6

Ingredients of Dual-tone Photo-imageable Hardmask Composition IV

| | |
|---|---|
| Resin II (from Example 2) | 39 grams |
| 1,1,1-Tris(hydroxymethyl)ethane (Aldrich, Milwaukee, WI) | 0.1 grams |
| Triphenylsulfonium tris(trifluoromethyl)methide (Ciba, Basel, Switzerland) | 0.06 grams |
| t-Butyl 4-hydroxy-1-piperidinecarboxylate (Aldrich, Milwaukee, WI) | 0.06 grams |
| Benzyltriethylammonium chloride (Aldrich, Milwaukee, WI) | 0.02 grams |
| Propylene glycol methyl ether acetate | 100 grams |

Composition IV was made by mixing the ingredients in Table 6. When all the solids dissolved, the composition was filtered through a membrane with 0.02-micrometer pores. In the composition, film-modifier, that is 1,1,1-tris(hydroxymethyl)ethane), is 2.7% of the resin by weight. Molar ratio of photoacid generator, that is triphenylsulfonium tris(trifluoromethyl)methide, to catalyst, that is benzyltriethylammonium chloride, is 1.42. Catalyst load is 0.014% of total weight.

Photolithographic Conditions for Composition IV:

| | |
|---|---|
| Wafer spin speed for coating | 1500-3000 revolutions per minute for film thickness of 40-60 nanometers |
| Post-application bake | 60-100° C. for 60 seconds |
| Suitable radiation wavelengths | 193 nanometers and 13.5 nanometers |
| Post-exposure bake | 60-120° C. for 90 seconds |
| Development | 10 seconds to 40 seconds in 4.8 grams of tetramethylammonium hydroxide per liter aqueous solution by spray, puddling or submerge |

Film of Composition IV after post-exposure bake is consisted of 38% or more silicon by weight.

What is claimed is:

1. A method of photoimaging hardmask films with dual tones, the method comprising:
   (i) incorporating a catalyst and a photoacid generator into a polysiloxane and polysilsesquioxane based hardmask composition, said catalyst being:
       capable of catalyzing condensation reactions of said polysiloxane and polysilsesquioxane resin molecules of said hardmask films, said condensation reactions forming inter- and intra-molecule linkage bonds, said linkage bonds forming molecular networks, and
       easy to be deactivated by photo-generated acids, and deactivated catalyst loses capability of promoting condensation reactions,
       and said photoacid generator being a chemical compound capable of producing acid upon exposure to radiations, said acid being able to deactivate said catalyst, and said acid being able to catalyze condensation reactions of said polysiloxane and polysilsesquioxane resin molecules of said hardmask films, and said radiations having wavelengths of 400 nanometers and shorter,
   (ii) radiating said polysiloxane and polysilsesquioxane based hardmask films with photomask images, said radiation causing:
       condensation reactions in dark areas of said photomask images, said condensation reactions being catalyzed by said catalyst, and said condensation reactions making the unradiated hardmask film areas insoluble in organic solvents or alkaline aqueous solutions, and said unradiated hardmask film areas being in positive tone,
       and condensation reactions in bright areas of said photomask images, said condensation reactions being catalyzed by excess acid, said excess acid being generated from said photoacid generator and being leftover from deactivation reactions with said catalyst, and said condensation reactions making the fully radiated hardmask film areas insoluble in organic solvents or alkaline aqueous solutions, and said fully radiated hardmask film areas being in negative tone,
       and no condensation reactions in transitions areas between dark and bright areas of said photomask images, in said transition areas catalyst being deactivated by photo-generated acid without excess acid, and said transition areas being soluble in organic solvents or alkaline aqueous solutions, and dual-tone images being formed.

2. The method of claim 1, wherein molar ratio of photoacid generator to catalyst is greater than 1.

3. The method of claim 1, wherein said condensation reactions taking place in said hardmask films at temperatures between 60° C. and 120° C.

4. Compositions of dual-tone photo-imageable hardmask, said compositions comprising of:
   polymeric resin, said resin is prepared from monomers comprising of molecular structures of

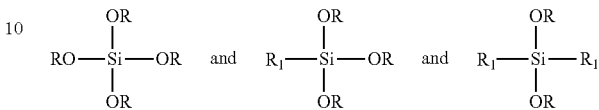

wherein R is selected from groups consisting of hydrogen and $C_1$-$C_4$ alkyls, and $R_1$ is selected from groups consisting of alkyl, aryl, alkene, alicyclic, epoxy-alkyl, and epoxy-cycloalkyl, and polymerization taking place to said monomers with presence of catalysts in organic solvents under temperatures from 80° C. to 110° C., and volatile alkanols being formed and removed, and polysiloxanes and polysilsesquioxanes being formed with molecular structures of

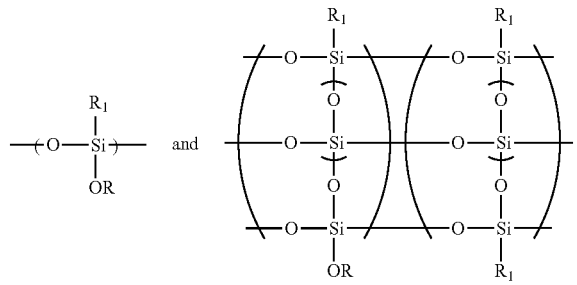

wherein R is selected from groups consisting of hydrogen and $C_1$-$C_4$ alkyls, and $R_1$ is selected from groups consisting of alkyl, aryl, alkene, alicyclic groups, epoxy-alkyl, and epoxy-cycloalkyl, and
   a catalyst, said catalyst being able to catalyze condensation reactions of said resin, and said catalyst being chosen from quaternary ammonium salts and amines, and said catalyst being readily deactivated by photo-generated acids, and said compositions comprising of 0.005% to 0.2% of said catalyst by weight, and
   a photoacid generator, said photoacid generator is selected from onium salts, said onium salts comprising triphenylsulfonium tris(trifluoromethyl)methide, and weight ratio of said photoacid generator to said catalyst being 1 to 3, and
   a film-modifier, said film-modifier being able to constrain diffusion pathways of said hardmask films, and said film-modifier not exceeding thirty percent of said resin by weight, and
   a quencher, said quencher is selected from alkaline compounds, said alkaline compounds being capable of neutralizing photo-generated acid, and said alkaline compounds being chosen from the group consisting n-boc-piperidine, t-butyl 4-hydroxy-1-piperidinecarboxylate, triethanol amine, 1-piperidineethanol, and benzyltriethylammonium chloride, and molar ratio of said quencher to said photoacid generator is 0.2-10, and
   a solvent or mixture of solvents, said solvents being chosen from the group consisting propylene glycol methyl ether, propylene glycol methyl ether acetate and ethyl lactate.

5. The compositions of claim 4, wherein said polymer resin and other solid chemicals making up less than ten percent of total weight.

6. The compositions of claim 4, wherein said dual-tone photo-imageable hardmask consisting of 30%-41% silicon in dry films.

7. A process of forming precursor structures on semiconductor substrates using dual-tone photo-imageable hardmask in conjunction with an intermediate layer, said process comprising of:
- forming an intermediate layer on a semiconductor substrate by spin-coating a composition, said composition comprising of at least one hydrocarbon resin and one solvent, and said semiconductor substrate being chosen from polysilicon, dielectrics and metals, and said semiconductor substrate having a flat surface or structured surface, and
- curing said intermediate layer on a hot surface, and cured intermediate layer having a thickness from 100 nanometers to 500 nanometers, and
- forming a film of dual-tone photo-imageable hardmask on said intermediate layer by spin-coating a composition of claim 4, and
- drying said film of dual-tone photo-imageable hardmask on a hotplate surface, said hotplate surface having a temperature between 40° C. and 100° C., and dried film of dual-tone photo-imageable hardmask having a thickness between 20 nanometers and 100 nanometers, and
- exposing said film of dual-tone photo-imageable hardmask to a radiation with image contrast, said radiation having a wavelength shorter than 400 nanometers, and
- conditioning exposed film of dual-tone photo-imageable hardmask on a heated surface, said heated surface having a temperature between 60° C. and 120° C., and
- removing half-way radiated portions from said image contrast of said film of dual-tone photo-imageable hardmask by organic solvents or alkaline aqueous solutions, said alkaline aqueous solutions comprising tetramethylammonium hydroxide water solutions, and said removing method comprising submerge or spray, and said removing process yielding images on said film of dual-tone photo-imageable hardmask, and
- removing portions of said intermediate layer under open areas of said images on said dual-tone photo-imageable hardmask by plasma, said plasma comprising of gases containing oxygen, and said removing process yielding images on said intermediate layer, and
- removing portions of said substrate under open areas of said images on said intermediate layer by plasma, said plasma comprising of gases chosen from chlorine, hydrogen bromide and fluorinated hydrocarbons, and said removing process yielding structures on said substrate.

8. A process of forming precursor structures on semiconductor substrates using dual-tone photo-imageable hardmask in conjunction with a thin antireflective coating, said process comprising of:
- forming a thin antireflective coating on a semiconductor substrate by spin-coating a composition, said semiconductor substrate being chosen from polysilicon, dielectrics and metals, and said semiconductor substrate having a flat surface or structured surface, and
- curing said thin antireflective coating on a heated surface, and cured thin antireflective coating having a thickness from 20 nanometers to 80 nanometers, and
- forming a film of dual-tone photo-imageable hardmask on said antireflective coating by spin-applying a composition of claim 4, and
- drying said film of dual-tone photo-imageable hardmask on a heated surface, said heated surface having a temperature between 40° C. and 100° C., and dried film of dual-tone photo-imageable hardmask having a thickness between 20 nanometers and 100 nanometers, and
- exposing said film of dual-tone photo-imageable hardmask to a radiation with image contrast, said radiation having a wavelength shorter than 400 nanometers, and
- conditioning said exposed film of dual-tone photo-imageable hardmask on a heated surface, said heated surface having a temperature between 60° C. and 120° C., and
- removing half-way radiated portions from said image contrast of said film of dual-tone photo-imageable hardmask by organic solvents or alkaline aqueous solutions, said alkaline aqueous solutions comprising tetramethylammonium hydroxide water solutions, and said removing method comprising submerge or spray, and said removing process yielding images on said film of dual-tone photo-imageable hardmask, and
- removing portions of said antireflective coating and said substrate under open areas of said images on said dual-tone photo-imageable hardmask by plasma, said plasma comprising of gases chosen from oxygen, chlorine, hydrogen bromide and fluorinated hydrocarbons, and said removing process yielding structures on said substrate.

\* \* \* \* \*